(12) United States Patent
Artman et al.

(10) Patent No.: US 7,423,876 B2
(45) Date of Patent: Sep. 9, 2008

(54) SYSTEM AND METHOD FOR HEAT DISSIPATION IN AN INFORMATION HANDLING SYSTEM

(75) Inventors: Paul T. Artman, Austin, TX (US); Robert D. Hrehor, Jr., Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 279 days.

(21) Appl. No.: 10/966,224

(22) Filed: Oct. 15, 2004

(65) Prior Publication Data

US 2006/0082971 A1    Apr. 20, 2006

(51) Int. Cl.
*H05K 7/20* (2006.01)

(52) U.S. Cl. .................... 361/700; 62/3.2; 62/259.2; 165/104.33

(58) Field of Classification Search ............. 361/700
See application file for complete search history.

(56) References Cited

U.S. PATENT DOCUMENTS

| | | | |
|---|---|---|---|
| 6,415,612 B1 * | 7/2002 | Pokharna et al. | 62/3.2 |
| 6,445,580 B1 | 9/2002 | Cohen et al. | 361/687 |
| 6,646,874 B2 * | 11/2003 | Pokharna et al. | 361/687 |
| 6,785,140 B2 | 8/2004 | Artman et al. | 361/709 |
| 6,822,863 B1 | 11/2004 | Artman et al. | 361/695 |
| 6,874,566 B1 | 4/2005 | Artman et al. | 165/80.3 |
| 6,880,346 B1 * | 4/2005 | Tseng et al. | 62/3.7 |

* cited by examiner

*Primary Examiner*—Gregory D Thompson
(74) *Attorney, Agent, or Firm*—Baker Botts L.L.P.

(57) ABSTRACT

A system and method is disclosed for dissipating heat within the interior of an information handling system. Heat from a heat source is directed to a heat sink and is also directed in parallel to a thermoelectric cooler. The thermoelectric cooler is oriented to direct heat in the direction of a second heat sink. A feedback communications link may be provided between the thermoelectric cooler and the heat source to regulate the operation of the thermoelectric cooler so that the temperature in the vicinity of the heat source is regulated within a temperature range.

14 Claims, 2 Drawing Sheets

SYSTEM AND METHOD FOR HEAT DISSIPATION IN AN INFORMATION HANDLING SYSTEM

TECHNICAL FIELD

The present disclosure relates generally to information handling systems and, more particularly, to a system and method for dissipating heat in an information handling system through use of a thermoelectric cooler.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information. Information handling systems may include or comprise one or more computer systems, data storage systems, or networking systems.

Within an information handling systems, one or more system components may generate an excessive amount of heat that could harm the function of the information handling system. The processor of a computer system, in particular, may generate an excessive amount of heat that may negatively affect the performance of the processor itself or components near the processor. Too much heat in the interior of a computer system could permanently damage one or more components of the computer system. Although fans have been used within the interior of the computer system to circulate air within the computer system and direct heated air out of the interior of the computer system, operating fans at higher speeds may negatively impact the acoustic quality of the computer system.

SUMMARY

In accordance with the present disclosure, a system and method is disclosed for dissipating heat within the interior of an information handling system. Heat from a heat source is directed to a heat sink and is also directed in parallel to a thermoelectric cooler. The thermoelectric cooler is oriented to direct heat in the direction of a second heat sink. A feedback communications link may be provided between the thermoelectric cooler and the heat source to regulate the operation of the thermoelectric cooler so that the temperature in the vicinity of the heat source is regulated within a temperature range.

The system and method disclosed herein is technically advantageous because it provides a system for rapidly and efficiently dissipating heat from the interior of an information handling system. The design provides a technique for directing heat through a heat conduit, such as a heat pipe, to a location at which the heat can be dissipated through the application of a thermoelectric cooler. As a result of this design, heat is directed away from the heat source in parallel paths, with one of those paths terminating in the combination of a thermoelectric cooler and a coupled heat sink.

Another technical advantage of the system and method disclosed herein is that a feedback loop can be included in the cooling system to regulate the amount of direct current voltage applied to the thermoelectric cooler. If the heat source is generating an excessive amount of heat, the direct current voltage applied to the thermoelectric cooler can be increased, resulting in the dissipation of more heat through the thermoelectric cooler. If the heat source is not generating an excessive amount of heat, the direct current voltage applied to the thermoelectric cooler can be decreased, thereby reducing the amount of power drawn by the thermoelectric cooler. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

A system and method for dissipating heat within an information handling system is disclosed. The system and method disclosed herein involves the distribution of heat from the heat source to a heat location in which the heat can be dissipated by a thermoelectric cooler. The thermoelectric cooler of the present invention is positioned within the computer system such that the heat dissipation path is a parallel path that extends in a first parallel path from the heat source to a first heat sink and in a second parallel path from the heat source to a thermoelectric cooler coupled to a second heat sink associated with the thermoelectric cooler.

Figure 1:
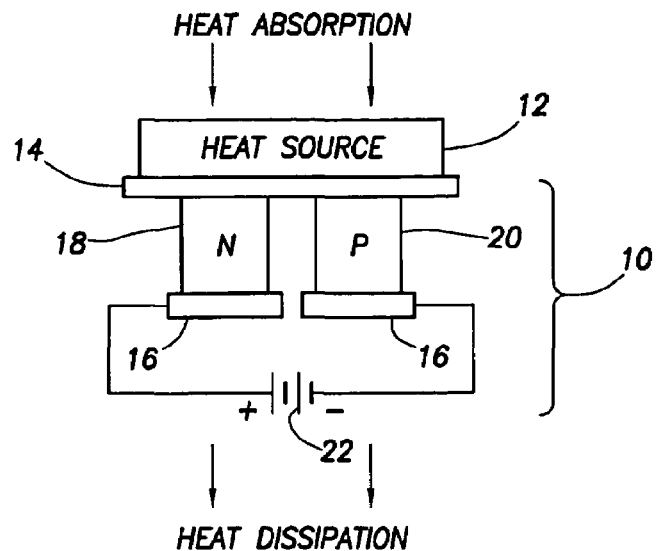
FIG. 1 is a diagram of the operation of a thermoelectric cooler.

Shown in FIG. 1 is a cross-sectional diagram of a thermoelectric cooler 10, which is positioned adjacent to a heat source 12. Thermoelectric cooler 10 may include an electrical insulator 14 which is positioned between heat source 12 and a pair of semiconductor materials, which are shown at 18 and 20. Semiconductor material 18 is an n-type semiconductor material, and semiconductor material 20 is a p-type semiconductor material. Coupled to each of the semiconductor materials opposite electrical insulator 14 is an electrical insulator 16. Electrical insulators 16 are electrically coupled to one another through a direct current voltage source 12, whose positive pole is coupled to the electrical insulator 16 that is adjacent to n-type semiconductor material 18 and whose negative pole is coupled to the electrical insulator that is adjacent to the p-type semiconductor material 18. Semiconductor elements 18 and 20 are coupled in series electrically with the direct current power source and are coupled in parallel thermally relative to the flow of heat from the heat source.

In operation, the application of a direct current to electrical insulators forces current to flow in a clockwise direction through the n-type semiconductor material and the p-type semiconductor material. The flow of current results in a decrease in temperature at the junction of the semiconductor elements 18 and 20 with electrical insulator 14. This decrease in temperature absorbs heat from the ambient environment adjacent electrical insulator 14. In this example, the decrease in temperature would result in the absorption of heat from heat source 12. The absorbed heat is effectively transported by the continued flow of electrons through the p-type material to the electrical insulator 16 that is adjacent p-type semiconductor 20, where the heat is released. The heat transfer capacity of a thermoelectric cooler is proportional to the direct current applied to the current transport path. A higher direct current voltage will result in more heat being transferred from the heat source to the heat dissipation region.

Figure 2:
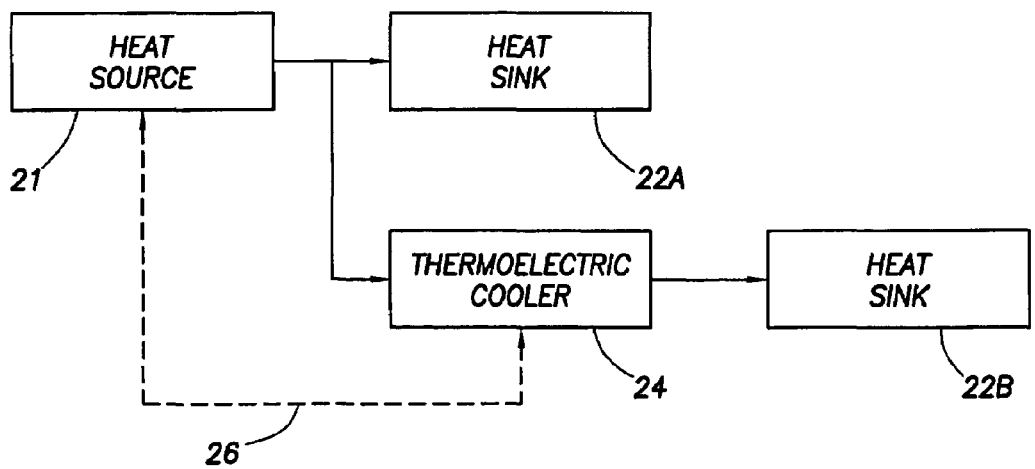
FIG. 2 is a diagram of heat transfer from a heat source within a computer system or information handling system.

Shown in FIG. 2 is a diagram of heat transfer from a heat source within a computer system or information handling system. Heat from heat source 21 is transferred in parallel to each of a first heat sink 22A and a thermoelectric cooler 24. The heat is transferred from thermoelectric cooler 24 to a second heat sink 22B. Dotted line 26 represents a feedback path for the measurement of heat output at heat source 21 and a corresponding direction to increase or decrease the heat transfer capacity of thermoelectric cooler 24.

Figure 3:
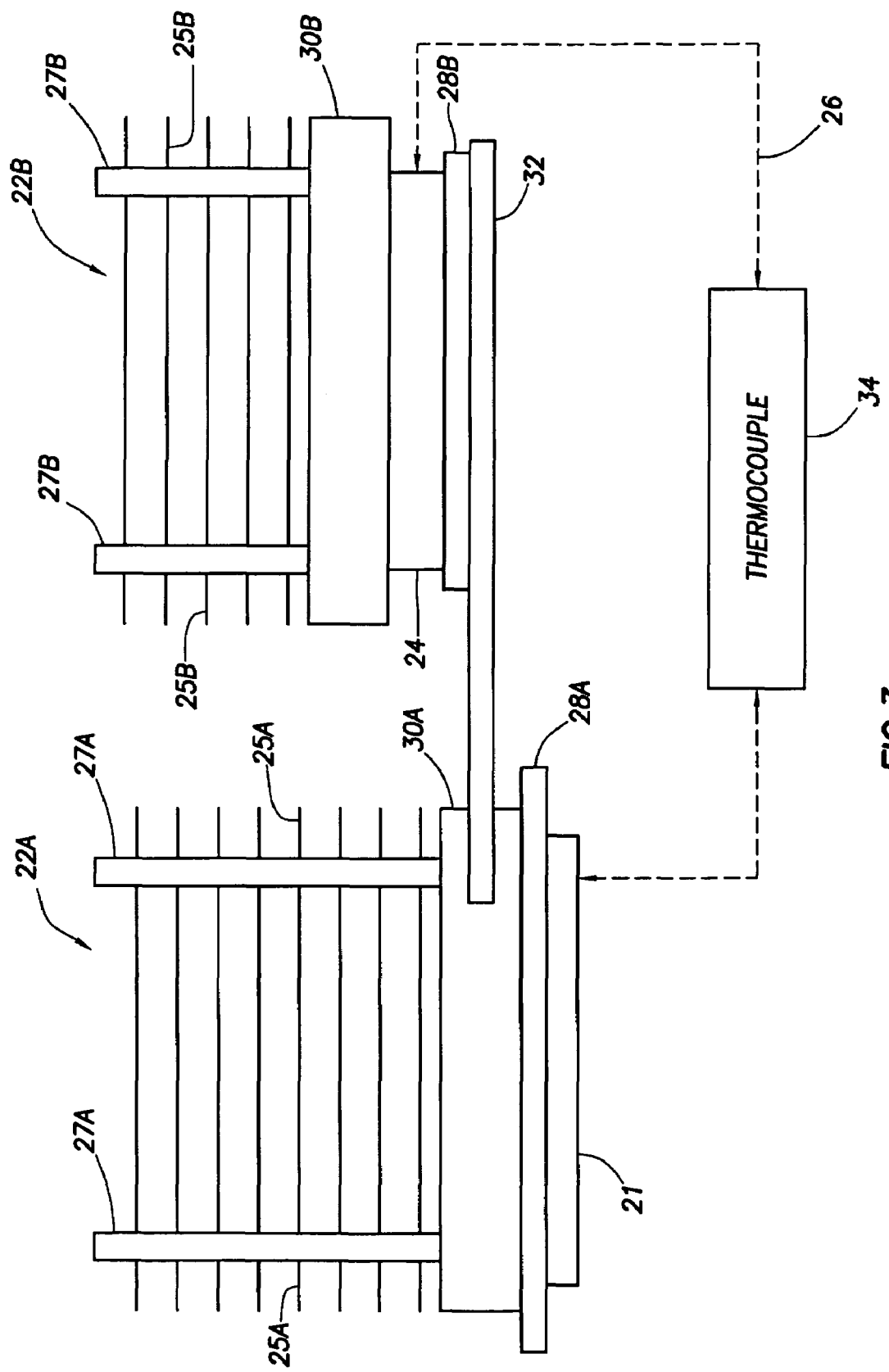
FIG. 3 is a cross-sectional diagram of a heat source coupled in parallel to a first heat sink, and a thermoelectric cooler and a second heat sink.

Shown in FIG. 3 is a cross-sectional view of a diagram of the arrangement of a heat source, heat sinks, and thermoelectric cooler. A thermal interface material Heat source 21, which may comprise a processor of a computer system, is placed in contact with a thermoelectric interface material 28A. In the case of a processor in a computer system, thermoelectric material 28 comprises a heat conductor that is placed between the top surface of the processor package and a heat sink that is placed on top of the thermoelectric material and processor package. A heat sink 22A is placed on top or physically adjacent to thermoelectric interface material 28A. Heat sink 22A includes a base 30A, which is coupled to a pair of heat pipes 27A. The heat pipes are coupled to and support a number of fins 25A. In operation, heat generated by processor 21 is radiated through thermoelectric interface material 28A and dissipated by heat sink 22A.

Coupled to the base 30A of heat sink 22A is a heat conduit or heat pipe 32. Heat pipe 32 serves as a heat conductor and radiates heat away from heat sink 22A and heat source 21. Heat pipe 32 terminates and is adjacent to thermoelectric interface material 28A, which itself positioned adjacent to thermoelectric cooler 24. Thermoelectric cooler 24 is positioned such that it directs heat in the direction away from heat pipe 32 and toward the direction of heat sink 22B. Heat sink 22B includes a base 30B. Heat pipes 27B are coupled to base 30B, and a plurality of fins 25B are coupled to and supported by heat pipes 27B.

When thermoelectric cooler 24 is engaged, the flow of current through thermoelectric cooler 24 creates a decrease in temperature at the region near the thermoelectric interface material 28B. This decrease in temperature absorbs heat from thermoelectric interface material 28B. This heat is then transported through thermoelectric cooler 24 to the base 30B of heat sink 22B. From the base 30B, the heat is radiated out through the fins 25B of heat sink 22B. The placement of thermoelectric cooler proximate heat conduit or heat pipe 32 creates a parallel path for the dissipation of heat from heat source 21. Also shown in FIG. 3 is a feedback loop that controls the heat flow capacity of thermoelectric cooler 24 on the basis of the heat being generated by heat source 21. A thermocouple 34 could be coupled between thermoelectric cooler 24 and heat source 21. As the temperature of the thermocouple rises, a signal could be sent to thermoelectric cooler 24 to apply more DC current to the current transport path of the thermoelectric cooler, thereby increase the amount of heat transferred by the thermoelectric cooler. As the temperature of the thermocouple falls, a signal could be sent to thermoelectric cooler 24 to apply less DC current to the current transport path of the thermoelectric cooler, thereby decreasing the amount of heat transferred by the thermoelectric cooler. The data and measurement signals of the feedback loop are represented by dotted line 26. The feedback loop provides a communications link through which the thermoelectric cooler can be instructed to (a) increase its heat transfer capability when required by the heat output of the heat source, and (b) decrease its heat transfer capability, thereby limiting power consumption by the thermoelectric cooler, when the heat output of the heat source is reduced. Modifying the direct current voltage applied to the thermoelectric cooler allows the temperature of the heat source to be regulated within a temperature range. In addition, a thermistor output from the component comprising the heat source can be used in a feedback loop to regulate the operation of and heat dissipation provided by the thermoelectric cooler. The temperature of the heat source may be measured by any element, including a thermocouple, thermistor, or thermometer, that is able to measure and transmit data concerning the temperature of the heat source.

As an alternative to or in addition to using a feedback loop to regulate the direct current voltage applied to the thermoelectric cooler of the system and method disclosed herein, the thermoelectric cooler could be continuously operated in a lower power state, which involves the low application of direct current voltage to the thermoelectric cooler. The use of the thermoelectric cooler, even in a low power condition, would reduce the heat in the vicinity of the heat source and would thereby reduce the need to use fans to dissipate heat in the vicinity of the heat source, thereby improving the acoustic characteristics of the information handling system. As another alternative for use in conditions characterized by high heat output by the heat source, the thermoelectric cooler could be operated at a coefficient of performance of 2-3, thereby significantly reducing the temperature of the interior of the information handling system, despite an increase in power consumed by the components of the information handling system.

It should be recognized that the system and method for heat dissipation disclosed herein is not limited in its application to heat sinks having the precise design characteristics of the heat sinks depicted in FIG. 3. Heat sinks have varying designs and may be designed, for example, with reference to the form factor of the information handling system. It should also be recognized that the system described herein is not limited in its application to dissipating heat from processors. The techniques disclosed herein may be used to dissipate heat generated by any other component of an information handling system. Although the present disclosure has been described in detail, it should be understood that various changes, substitutions, and alterations can be made hereto without departing from the spirit and the scope of the invention as defined by the appended claims.

What is claimed is:

1. A system for dissipating heat from a heat source, comprising:
    a first heat sink proximate the heat source;
    a conduit directing heat away from the heat source, wherein the conduit has a first end positioned proximate the heat source and a terminal end;
    a thermoelectric cooler positioned proximate the terminal end of the conduit; and
    a second heat sink proximate the thermoelectric cooler, whereby the thermoelectric cooler directs heat away from the terminal end of the conduit and toward the second heat sink, wherein the first heat sink comprises:
    a base;
    a plurality of heat pipes; and
    a plurality of fins coupled to the pipes.

2. The system for dissipating heat from a heat source of claim 1, wherein the first end of the conduit is coupled to the base of the first heat sink.

3. The system for dissipating heat from a heat source of claim 2, wherein the conduit is a heat pipe.

4. The system for dissipating heat from a heat source of claim 3, wherein a thermoelectric interface material is positioned between the base of the first heat sink and the heat source.

5. A system for dissipating heat from a heat source, comprising:
    a first heat sink proximate the heat source;
    a conduit directing heat away from the heat source, wherein the conduit has a first end positioned proximate the heat source and a terminal end;
    a thermoelectric cooler positioned proximate the terminal end of the conduit; and
    a second heat sink proximate the thermoelectric cooler, whereby the thermoelectric cooler directs heat away from the terminal end of the conduit and toward the second heat sink, wherein the second heat sink comprises:
    a base;
    a plurality of heat pipes; and
    a plurality of fins coupled to the pipes.

6. The system for dissipating heat from a heat source of claim 5, wherein a thermoelectric interface material is positioned between the terminal end of the conduit and the thermoelectric cooler.

7. A system for dissipating heat from a heat source, wherein the heat source is a processor, comprising:
    a first heat sink proximate the heat source;
    a conduit directing heat away from the heat source, wherein the conduit has a first end positioned proximate the heat source and a terminal end;
    a thermoelectric cooler positioned proximate the terminal end of the conduit;
    a second heat sink proximate the thermoelectric cooler, whereby the thermoelectric cooler directs heat away from the terminal end of the conduit and toward the second heat sink;
    a thermometer for measuring the heat generated by the processor; and
    communications link between the thermoelectric cooler and thermometer for transmitting a signal to the thermoelectric cooler to increase or decrease the heat output of the thermoelectric cooler on the basis of the heat generated by the processor.

8. A method for controlling the temperature in the vicinity of a processor, comprising:
    providing a first heat sink placed in a position adjacent to the processor;
    providing a thermoelectric cooler distant from the processor;
    providing a heat conduit between the first heat sink and the thermoelectric cooler, wherein the step of providing a heat conduit between the first heat sink and the thermoelectric cooler comprises the step of coupling the heat conduit between a base of the first heat sink and the thermoelectric cooler;
    providing a second heat sink positioned adjacent to the thermoelectric cooler;
    applying a direct current voltage to the thermoelectric cooler to absorb heat from the heat conduit and direct the heat to the second heat sink; and monitoring the heat generated by the processor and increasing the direct current voltage applied to the thermoelectric cooler in response to an increase in the amount of heat generated by the processor.

9. The method for controlling the temperature in the vicinity of a processor of claim 8, further comprising the step of monitoring the heat generated by processor and decreasing the direct current voltage applied to the thermoelectric cooler in response to a decrease in the amount of heat generated by the processor.

10. The method for controlling the temperature in the vicinity of a processor of claim 9, further comprising the step of providing a thermoelectric material positioned between the processor and the first heat sink.

11. The method for controlling the temperature in the vicinity of a processor of claim 10, further comprising the step of providing a thermoelectric material positioned between the heat conduit and the thermoelectric cooler.

12. The method for controlling the temperature in the vicinity of a processor of claim 10, wherein the heat conduit is a heat pipe.

13. A cooling system for dissipating heat from a component,
    a first heat sink positioned proximate the component;
    a thermoelectric cooler positioned distant from the component;
    a heat conduit coupled between the first heat sink and the thermoelectric cooler, wherein the heat conduit is a heat pipe that has a first end coupled to a base of the first heat sink and a second end positioned proximate the thermoelectric cooler;
    a second heat sink positioned proximate the thermoelectric cooler;

a thermometer for measuring the heat generated by the processor; and a communications link between the thermoelectric cooler and thermometer for transmitting a signal to the thermoelectric cooler to increase or decrease the heat output of the thermoelectric cooler on the basis of the heat generated by the processor, wherein the application of a direct current voltage in the thermoelectric cooler causes heat to be directed by the thermoelectric cooler away from the heat conduit and toward the second heat sink.

14. The cooling system of claim 13, further comprising:

a thermal interface material positioned between the processor and the first heat sink; and a thermal interface material positioned between the second end of the heat pipe and the thermoelectric cooler.

\* \* \* \* \*